United States Patent [19]

Uhlig et al.

[11] 4,063,949

[45] Dec. 20, 1977

[54] PROCESS FOR THE PREPARATION OF PLANOGRAPHIC PRINTING FORMS USING LASER BEAMS

[75] Inventors: Fritz Uhlig; Ine Gramm, both of Wiesbaden, Germany

[73] Assignee: Hoechst Aktiengesellschaft, Germany

[21] Appl. No.: 770,788

[22] Filed: Feb. 22, 1977

[30] Foreign Application Priority Data

Feb. 23, 1976 Germany ............................ 2607207

[51] Int. Cl.² ................................................ G03F 7/08

[52] U.S. Cl. .................................. 96/27 E; 96/86 R; 96/36.3

[58] Field of Search .................. 96/27 E, 27 H, 86 R, 96/36.3

[56] References Cited

U.S. PATENT DOCUMENTS 3,664,737 5/1972 Lipp ..................................... 96/27 H

OTHER PUBLICATIONS

Chemical Abst., vol. 65/1666d, vol. 68, col. 100673u.

*Primary Examiner*—John D. Welsh

*Attorney, Agent, or Firm*—James E. Bryan

[57] ABSTRACT

This invention relates to an improvement in the process for the preparation of a planographic printing form in which a recording material comprising a support of anodically oxidized aluminum and a recording layer thereon is imagewise irradiated with a laser beam, thereby rendering the irradiated portions of the recording layer oleophilic and/or insoluble, and the non-irradiated portions of the recording layer are then removed, where necessary, by washing with a developer liquid, the improvement comprising an oxide layer on said support weighing at least 3 grams per square meter.

2 Claims, No Drawings

PROCESS FOR THE PREPARATION OF PLANOGRAPHIC PRINTING FORMS USING LASER BEAMS

The present invention relates to a process for the preparation of planographic printing forms, wherein an aluminum support covered with a reproduction layer is imagewise irradiated with a laser beam, thus producing oleophilic or insoluble image areas in the reproduction layer.

For the photomechanical preparation of planographic printing forms, a copying material comprising a light-sensitive layer, ususally a layer which is sensitive to ultraviolet light, for example a layer containing a diazo, azido, or photopolymerizable compound, is imagewise exposed and then developed with a suitable developer or decoating solution, oleophilic image areas and hydrophilic non-image areas thus being produced. Normally, the oleophilic image areas are the areas retained after development or decoating, whereas the non-image areas are the areas of the support surface which were bared during development or decoating.

It is known to replace the conventional contact exposure to actinic light by an imagewise controlled irradiation with a laser beam.

U.S. Pat. No. 3,664,737, discloses a printing plate which comprises an UV-light-sensitive layer, preferably a diazo layer, and is irradiated with a laser beam.

German Auslegeschrift No. 1,571,833, discloses a process for the preparation of planographic printing forms or of hectographic printing forms in which a silicone layer of poor adhesion is destroyed by a laser beam or an electron beam.

German Offenlegungsschrift No. 2,302,398, discloses a process for the preparation of printing forms in which a commercially available presensitized printing plate carrying a photopolymerizable layer is cured by imagewise irradiation with a laser beam and then developed.

In German Auslegeschrift No. 2,448,325, and in German Offenlegungsschrift No. 2,543,820, it is proposed to prepare printing plates by irradiation of non-light-sensitive recording layers with laser beams, the irradiated areas of the recording layer becoming either permanently oleophilic or, if an oleophilic layer was used, becoming insoluble in an appropriately selected developer liquid. Anodized aluminum is mentioned, inter alia, as a suitable support.

It is the object of the present invention to improve the properties of recording materials containing non-light-sensitive or light-sensitive layers, in particular their sensitivity toward laser radiation.

The invention is based on a process for the preparation of planographic printing forms wherein a recording material comprising a support of anodically oxidized aluminum and a recording layer on the oxide layer is imagewise irradiated with a laser beam, thus rendering the irradiated portions of the recording layer oleophilic and/or insoluble, and the nonirradiated portions of the layer are then removed, where necessary, by washing with a developer liquid.

In the process according to the invention, a support with an oxide layer is used in which the oxide layer has a weight of at least 3 grams per square meter, preferably 5 to 12 grams per square meter.

By using oxide layers of these minimum thicknesses, it is possible to employ substantially shorter exposure times or lower intensities of radiation than in the case of thinner oxide layers. This effect is surprising.

The supports for the recording materials to be used in the process according to the invention are prepared in known manner. Prior to anodic oxidation, the aluminum is preferably roughened by a mechanical, chemical or electrolytic treatment. A combination of an electrolytic roughening process with an anodic oxidation has proved to be particularly advantageous for a continuous process. Roughening is effected in a bath composed of a dilute aqueous mineral acid, for example hydrochloric or nitric acid, using direct or alternating current.

Anodization also is effected in an aqueous acid bath, for example sulfuric acid or phosphoric acid, preferably applying direct current. The current densities and anodization times are so selected that oxide layers of the thicknesses mentioned above result. The layer should have a thickness corresponding to at least 3 grams per square meter. The upper limit of the layer thickness is not critical, but normally no substantial improvement is achieved by using layers whose weight exceeds 15 grams per square meter. If considerably thicker layers are used, for example layers weighing more than about 30 grams per square meter, there is the added risk of cracks forming in the oxide layer when the plate is bent.

Layers that are sensitive to UV-light and layers that are insensitive to UV-light as well as hydrophilic and oleophilic layers may be used as recording layers, the last-mentioned layers requiring development or decoating of the image-free areas after imagewise irradiation with a laser beam before they can be clamped in an offset printing machine and used for printing in the normal manner, applying fatty ink and fountain solution.

Suitable UV-sensitive layers are the known diazo, azido, or photopolymerizable layers which also may contain bindera, dyestuffs, plasticizers and the like, if desired. Even in the case of layers which are positive-working under normal conditions, i.e. when they are exposed to UV light, the image areas from which printing is to be effected are always produced in the irradiated areas by the inventive process, which means that the layers are invariably negative-working.

Suitable oleophilic recording layers which are insensitive to UV light are those which are preponderantly composed of water-insoluble, polymeric organic substances, for example novolaks, epoxide resins, resols, methoxymethyl polycaprolactam, or polystyrene. Mixtures of such substances also may be used. Small amounts of dyestuffs, plasticizers, fatty acids, and wetting agents may be added to the layer, if desired. Layers of this type are disclosed in German Offenlegungsschrift No. 2,543,820.

After irradiation, the UV-light-sensitive and the light-insensitive, oleophilic layers are developed or decoated.

Alkaline or weakly acid solutions containing inorganic salts, weak acids and possibly wetting agents and dyestuffs are suitable as developer solutions. Further, aqueous solutions containing up to 40 percent of their volume of low molecular weight aliphatic alocohols, for example propanols, or other water-miscible organic solvents, are also suitable.

As light-insensitive, hydrophilic recording layers the most varied types of layers and surfaces may be used, for example those disclosed in German Offenlegungsschrift No. 2,448,325.

Layers of water-soluble, monomeric or polymeric organic substances capable of forming uniform, thin, non-crystallizing films form an important group among the suitable layers.

Suitable water-soluble polymers are, for example: polyvinyl alcohol, polyvinyl pyrrolidone, polyalkylene oxide, polyalkylene imines, cellulose ethers, such as carboxy methyl cellulose or hydroxy ethyl cellulose, polyacrylamide, polyacrylic acid, polymethacrylic acid, starch, dextrin, casein, gelatin, gum arabic and tannin, to which sensitizing dyestuffs advantageously may be added.

Suitable monomeric or low molecular weight water-soluble substances are, for example: water-soluble dyestuffs, such as Rhodamines, Methylene Blue, Astrazon Orange, eosin or triphenyl ethane dyestuffs, e.g. Crystal Violet.

Water-insoluble, hydrophilic inorganic or organic substances also may be used with success.

Examples of organic water-insoluble hydrophilic substances which may be used are: association products of phenol resins and polyethylene oxides, such as those disclosed in German Offenlegungsschrift No. 1,447,978, hardened melamine-formaldehyde resins according to British Pat. No. 907,289, or amine-urea-formaldehyde condensation resins or sulfonated urea-formaldehyde resins as disclosed in German Auslegeschrift No. 1,166,217; further, cross-linked hydrophilic colloids, for example cross-linked polyvinyl alcohol, to which hydrophilic inorganic pigments may be added, if desired.

Further, it is possible to use water-insoluble hydrophilic inorganic pigments embedded in the anodic oxide layer of the support, for example layers of pyrogenic silica.

A further important group of water-insoluble hydrophilic layers which may be used in accordance with the present invention are layers which are obtained by treating the aluminum oxide surface with monomeric or polymeric organic or inorganic acids or their salts, or certain complex acids or salts. Layers of this type are well-known in the art of offset printing and are widely used for the pretreatment of metal supports to which light-sensitive layers are to be applied. Examples of suitable treating agents are alkali silicates (German Auslegeschrift No. 1,471,707), phosphonic acids and their derivatives (German Offenlegungsschrift No. 1,621,478), titanium or zirconium hexahalides (German Auslegeschriften Nos. 1,183,919, and 1,192,666), organic polyacids (German Pat. No. 1,091,433), monomeric carboxylic acids and their derivatives, phosphorus molybdates, silico molybdates, and the like. Usually, however, treating solutions with higher concentrations of the above-mentioned substances than are normally used are employed for the purpose of the present invention, preferably solutions containing from about 3 to 15 percent by weight of such substances.

In the case of hydrophilic layers, the irradiated printing plate is set up in an offset machine without any further treatment, and oily or fatty printing inks and fountain solution are applied in the normal manner. If the original hydrophilic layer was water-soluble, it may occur that this layer is dissolved away by the fountain solution. If the hydrophilic layer is water-insoluble, virtually nothing of the substance is removed by the fountain solution and the non-irradiated areas of the layer act directly as the image background.

Suitable solvents for the commerical production of the layers are liquids which are generally known to have good dissolving capacity. Ethylene glycol monomethylether, ethylene glycol monoethylether, dimethyl formamide, diacetone alcohol and butyrolactone are preferred. In order to produce uniform layers, ethers and/or esters, such as dioxane, tetrahydrofuran, butyl acetate or ethylene glycol methyl acetate are frequently added to these solvents.

For the preparation of the copying material according to the invention from which printing plates are prepared, the above-mentioned substances are dissolved in one or more of the above-mentioned solvents, applied to the support to be used according to the invention, and the applied layer is then dried. Coating may be effected by whirlercoating, spraying, dipping, roller application, or with the aid of a film of liquid.

Although no definite explanation can be given as to the type of change occurring in the recording layers under irradiation by laser beams, it may be assumed that a polymerization reaction or crosslinking reaction take place, possibly with simultaneous splitting-off of hydrophilic groups, especially OH groups, or conversion of such groups into hydrophobic groups.

Lasers which may be used for the purposes of the present invention are appropriately powered relatively short-wave lasers, for example argon lasers, krypton ion lasers, helium-cadmium lasers which emit between about 300 and 600 nm, and for some layers also $CO_2$ lasers emitting at about 10.6$\mu$m or YAG lasers emitting at about 1.06$\mu$m.

The laser beam is controlled by means of a given programmed line and/or screen movement. Processes and devices for controlling laser beams by means of computers and bundling, modulation or deflection of laser beams are no part of the present invention; they are described in various publications, for example in German Offenlegungsschriften Nos. 2,318,133 (pages 3 et seq.) 2,344,233 (pages 8 et seq.), and in U.S. Pat. Nos. 3,751,587; 3,745,586; 3,747,117; 3,475,760; 3,506,779; and 3,664,737.

Preferably, the layers are imagewise irradiated with an argon laser of between 1 and 25 watts or with a $CO_2$ laser. Speeds of up to and even exceeding 110 m per second are achieved, depending upon the sensitivity or absorption capacity of the layer used. By focusing the laser beam with a lens, focal areas of less than 50$\mu$m diameter are produced on the layer. If light-insensitive layers are used, irradiation may take place under normal light conditions.

By irradiation with laser beams, a very durable oleophilization of the surface is achieved, so that very long printing runs are frequently possible.

The following examples further illustrate preferred embodiments of the invention. Unless otherwise stated, all percentages are by weight. One part by weight is 1 gram if 1 milliliter is selected as one part by volume.

EXAMPLE 1

A roll of bright rolled aluminum is electrolytically roughened in a continuous process, using a conveyor belt, and is then anodically oxidized for 146 seconds at 40° C with a 9A/dm² direct current in an aqueous bath containing 150 grams of $H_2SO_4$ per liter. An anodic oxide layer weighing 10 grams per square meter is thus obtained. The layer is then treated for 30 seconds at 90° C with a 2 percent aqueous solution of polyvinyl phosphonic acid and dried.

The oxide layer is then imagewise irradiated over all spectral lines with an argon ion laser of 5 watts at a speed of at least 3.5 meters per second.

The plate, which thus has been rendered completely oleophilic in the irradiated areas, is then directly clamped in an offset machine and used for printing, without any intermediate developing or decoating steps.

An anodic oxide layer weighing 2.0 grams per square meter, which has been prepared on an aluminum plate by anodizing for 26 seconds in the same manner and had likewise been treated with polyvinyl phosphonic acid, is not rendered sufficiently oleophilic in the irradiated areas even if it is irradiated with five times the current density, i.e. 25 watts, at a speed of 3.5 meters per second.

EXAMPLE 2

An aluminum plate provided with an oxide layer of 3 grams per square meter by 40 seconds' anodization as in Example 1 is coated with an aqueous solution containing 1% of Crystal Violet and 2% polyvinyl alcohol with a degree of hydrolysis of 88% and a viscosity of 4 cp (in a 4% aqueous solution at 20° C). The plate is irradiated with an argon laser of 5 watts and is then wiped over with water, whereby the areas not struck by the laser beam are decoated, whereas the image areas are unaffected.

An aluminum plate carrying a similar coating on an oxide layer weighing only 1 gram per square meter must be irradiated with an intensity of more than 10 watts if an approximately equivalent result is to be achieved.

EXAMPLE 3

An aluminum plate carrying an anodically produced oxide layer weighing 5 grams per square meter (anodized for 75 seconds in the manner described in Example 1) is coated with a solution containing 1% of a diazo polycondensate — obtained by condensation of 32.3 grams of 3-methoxydiphenylamine-4-diazonium sulfate and 25.8 grams of 4,4'-bis-methoxymethyl-diphenylether in 170 grams of 85% phosphoric acid at 40° C and separation of the reaction product in the form of the mesitylene sulfonate — and 0.5% of a polyvinyl formal (molecular weight 30,000, OH group content 7 molar percent, acetate content 20 to 27 molar percent). The coated plate is imagewise irradiated with an argon laser of 10 watts output and wiped over with a developer of the following composition: 6% of Mg sulfate, 0.7% of a wetting agent (fatty alcohol polyglycol ether), 65% of water, and 32% of n-propanol. In this manner, the areas not struck by the laser beam are removed from the support.

A plate which had been coated in the same manner but carried an oxide layer weighing only 1.0 gram per square meter must be irradiated with 20 watts in order to produce a similar result.

EXAMPLE 4

An aluminum plate provided with an anodic oxide layer weighing 10 grams per square meter is coated with an aqueous solution containing 0.3% of eosin and 1 percent of a polyvinyl alcohol with a degree of hydrolysis of 98% and a viscosity of 10 cP (in a 4% aqueous solution at 20° C)

The plate is imagewise irradiated with a 300 watt $CO_2$ laser the output of which was reduced to 30 watts. In this manner, complete oleophilization of the areas struck by the laser beam is achieved. After wiping with water, the plate may be used for printing.

An aluminum plate which had been coated in the same manner but had an oxide layer weighing only 1 gram per square meter was found to be still incompletely cured and not entirely oleophilic after irradiation with 140 watts.

EXAMPLE 5

The plate described in Example 3 is imagewise irradiated with a $CO_2$ laser. An intensity of 30 watts is sufficient for an oleophilic hardening of the layer.

An identical layer applied to an oxide layer weighing only 1 gram per square meter requires an irradiation with a $CO_2$ laser of at least 140 watts in order to achieve approximately equal results.

EXAMPLE 6

An aluminum plate with an anodic oxide layer weighing 10 grams per square meter is coated with the following solution:

1.15 p.b.w. of the esterification product of 1 mole of 2,3,4-trihydroxy-benzophenone and 3 moles of naphthoquinone-(1,2)-diazide-(2)-5-sulfonic acid chloride, 0.40 p.b.w. of the esterification product of 1 mole of 2,2'-dihydroxy-dinaphthyl-(1,1')-methane and 2 moles of naphthoquinone-(1,2)-diazide-(2)-5-sulfonic acid chloride, 7.0 p.b.w. of a novolak of the type which has a softening range between 112° and 119° C and a phenolic OH-group content of 14% by weight, and 90.0 p.b.w. of ethyleneglycol monomethylether.

The plate is imagewise irradiated with a 25 watt argon ion laser, then its entire surface is exposed to the light of a metal-halide lamp, and finally the plate is wiped with a developer of the following composition: 5% of Na-metasilicate, 3.3% of trisodium phosphate, and 0.4% of monosodium phosphate in water.

In this manner, the areas of the layer not struck by the laser beam are dissolved away, whereas the irradiated areas are retained as the oleophilic image areas.

If an aluminum plate with an oxide layer weighing only 1 gram per square meter is coated and irradiated in the same manner, at an intensity of 25 watts, the maximum speed must be considerably reduced in order to render the irradiated areas completely insoluble in the developer after irradiation with UV light.

EXAMPLE 7

An aluminum plate with an anodic oxide layer weighing 10 grams per square meter is coated with a solution containing 1% of an unplasticized urea resin ("Resamin" SHF 237, a product of Hoechst AG, Werk Albert, Wiesbaden, Germany) and 0.5% of Rhodamine 6 GDN dissolved in ethyleneglycol monomethyl ether.

The plate is imagewise irradiated with a 5 watt argon laser at a speed of 3.5 meters per second and the areas not struck by the laser beam are then decoated by means of an aqueous solution of the following composition:

3.7% of magnesium sulfate . 7 $H_2O$ 15.6% of n-propanol 0.6% of ethyleneglycol monobutylether, 0.4% of a non-ionic wetting agent (polyoxyethylene alkylphenol ether).

If the same layer is applied to an anodic oxide layer weighing about 1 gram per square meter, even an irradiation with an intensity of 25 watts will not suffice to render the layer cured and sufficiently oleophilic.

The thickness of the anodically produced oxide layers tested in the preceding examples was determined as follows:

After freeing it from the air oxide layer on its back, a sample of the anodized aluminum plate was weighed and then immersed, for 4 minutes at 60° C, in a solution of the following composition:

300 ml of water, 960 ml of phosphoric acid (85% concentration), and 480 g of chromium acid anhydride.

By this treatment, the oxide layer was dissolved away, while the aluminum plate itself was not affected. After drying, the sample plate was weighed again and then the weight of the oxide layer was calculated from the difference in weights and the surface of the plate.

It will be obvious to those skilled in the art that many modifications may be made within the scope of the present invention without departing from the spirit thereof, and the invention includes all such modifications.

What is claimed is:

1. In the process for the preparation of a planographic printing form in which a recording material comprising a support of anodically oxidized aluminum and a recording layer thereon is imagewise irradiated with a laser beam, thereby rendering the irradiated portions of the recording layer oleophilic and/or insoluble, and the non-irradiated portions of the recording layer are then removed, where necessary, by washing with a developer liquid, the improvement comprising an oxide layer on said support weighing at least 3 grams per square meter.

2. A process according to claim 1 in which said oxide layer weighs from 5 to 12 grams per square meter.

* * * * *